(12) United States Patent
Earls

(10) Patent No.: US 7,702,305 B2
(45) Date of Patent: Apr. 20, 2010

(54) USE OF A PRESELECTION FILTER BANK AND SWITCHED LOCAL OSCILLATOR COUNTER IN AN INSTRUMENTATION RECEIVER

(75) Inventor: Jeffrey D. Earls, Forest Grove, OR (US)

(73) Assignee: Tektronix, Inc., Beaverton, OR (US)

( * ) Notice: Subject to any disclaimer, the term of this patent is extended or adjusted under 35 U.S.C. 154(b) by 574 days.

(21) Appl. No.: 11/674,648

(22) Filed: Feb. 13, 2007

(65) Prior Publication Data

US 2007/0152652 A1     Jul. 5, 2007

Related U.S. Application Data

(62) Division of application No. 10/804,664, filed on Mar. 18, 2004, now abandoned.

(51) Int. Cl.
*H04B 1/18*     (2006.01)

(52) U.S. Cl. .................................. 455/189.1; 455/190.1

(58) Field of Classification Search ............... 455/188.1, 455/189.1, 190.1, 192.1, 196.1, 255–260, 455/265, 132–133, 192.2; 375/344; 324/76.11, 324/76.19, 76.23
See application file for complete search history.

(56) References Cited

U.S. PATENT DOCUMENTS 3,931,578 A    1/1976   Gittinger 5,233,546 A    8/1993   Witte
6,029,054 A    2/2000   Lemley
6,316,928 B1   11/2001   Miyauchi
6,850,739 B2   2/2005   Higuchi

FOREIGN PATENT DOCUMENTS

| JP | 01-142469 | 6/1989 |
|---|---|---|
| JP | 11-133071 | 5/1999 |
| JP | 11-264847 | 9/1999 |
| WO | WO 98/54584 | 12/1998 |

OTHER PUBLICATIONS

English summary of JP 1-142469,1 page, Jun. 1989.
English translation (JPO machine translation) of JP 11-133071, 14 pages, May 1999.
English translation (JPO machine translation) of JP 11-264847, 5 pages, Sep. 1999.

*Primary Examiner*—Nguyen Vo
(74) *Attorney, Agent, or Firm*—Francis I. Gray; Michael A. Nelson

(57) ABSTRACT

An instrumentation receiver architecture for processing an RF signal has a dual-IF channel architecture, a low-band IF channel and a high-band IF channel, and a tunable oscillator, such as a yttrium-iron-garnet (YIG) tunable oscillator (YTO), a voltage controlled oscillator (VCO), a bank of VCOs and the like, providing a different mixing frequency range to each channel, generally a higher frequency range to the high-band IF channel than to the low-band IF channel. At the input to the high-band IF channel is a bank of preselection filters for selecting a frequency band from the RF signal for processing by the high-band IF channel. A switch selects the output from one of the low-band and high-band IF channels for further processing.

22 Claims, 3 Drawing Sheets

USE OF A PRESELECTION FILTER BANK AND SWITCHED LOCAL OSCILLATOR COUNTER IN AN INSTRUMENTATION RECEIVER

CROSS REFERENCE TO RELATED APPLICATIONS

This application is a divisional of U.S. patent application Ser. No. 10/804,664, filed Mar. 18, 2004, the entire contents of which are incorporated herein by reference.

BACKGROUND OF THE INVENTION

The present invention relates to spectrum analysis, and more particularly to an instrumentation receiver using a preselection filter bank and a switched local oscillator counter.

A known instrumentation receiver described in U.S. Pat. No. 6,316,928 incorporates a yttrium-iron-garnet (YIG) tuned oscillator (YTO) as a sweep frequency local oscillator and a YIG tuned filter (YTF) as a frequency preselector for an incoming RF signal. The YTF is used to remove image products in a high frequency band before a first conversion stage. However the YTF has the disadvantages of high cost and limited bandwidth. The architecture disclosed in the '928 patent is a dual-IF architecture having a baseband IF channel and a high-band IF channel both using the same YTO. The baseband IF channel upconverts the RF signal to a first IF frequency, bandpass filters the first IF frequency and downconverts to a second IF frequency. The high-band IF channel preselects a frequency band using the YTF and downconverts directly to the second IF frequency. An input switch allows the RF signal to be processed by either the baseband or high-band IF channel, with a corresponding output switch selecting the selected IF channel for further processing. This architecture provides a two-octave bandwidth from a one-octave YTO rather than using a more expensive two-octave YTO.

What is desired is an instrumentation receiver that has a lower cost while providing a greater bandwidth.

BRIEF SUMMARY OF THE INVENTION

Accordingly the present invention provides an instrumentation receiver architecture for processing an RF signal that has a dual-IF channel architecture, a low-band IF channel and a high-band IF channel, that includes a bank of preselection filters at the input of the high-band IF channel to select a frequency band from the RF signal for processing by the high-band IF channel. A common tunable oscillator, such as an yttrium-iron-garnet (YIG) tunable oscillator (YTO), a voltage controlled oscillator (VCO), a bank of VCOs, or the like, is used to provide a different first stage mixing frequency range to both IF channels, the frequency range applied to the high-band IF channel generally being higher than that applied to the low-band channel. In a first implementation the low-band IF channel up-converts a lowpass filtered RF signal to an first IF signal and then down-converts the first IF signal to a second IF signal, while the high-band IF channel down-converts the selected frequency band of the RF signal to the second IF signal. The output from the selected one of the IF channels is digitized for processing by a digital signal processor (DSP). In a second implementation the outputs from the first stage conversion in each IF channel, having different IF frequencies, are selectively input to a configurable down conversion stage which converts the outputs from the respective first stages to a common IF frequency for further processing. In a third implementation the low-band IF channel also contains a bank of preselection filters so that the input to the first stage is either the lowpass filtered RF signal or a selected frequency band from the RF signal, with the first stage acting as an up-converter when the input is the lowpass filtered RF signal and as a down-converter when the input is the selected frequency band. The output from the first stages are input to the configurable down conversion stage as in the second implementation.

The objects, advantages and other novel features of the present invention are apparent from the following detailed description when read in conjunction with the appended claims and attached drawing.

DETAILED DESCRIPTION OF THE INVENTION

Figure 1:
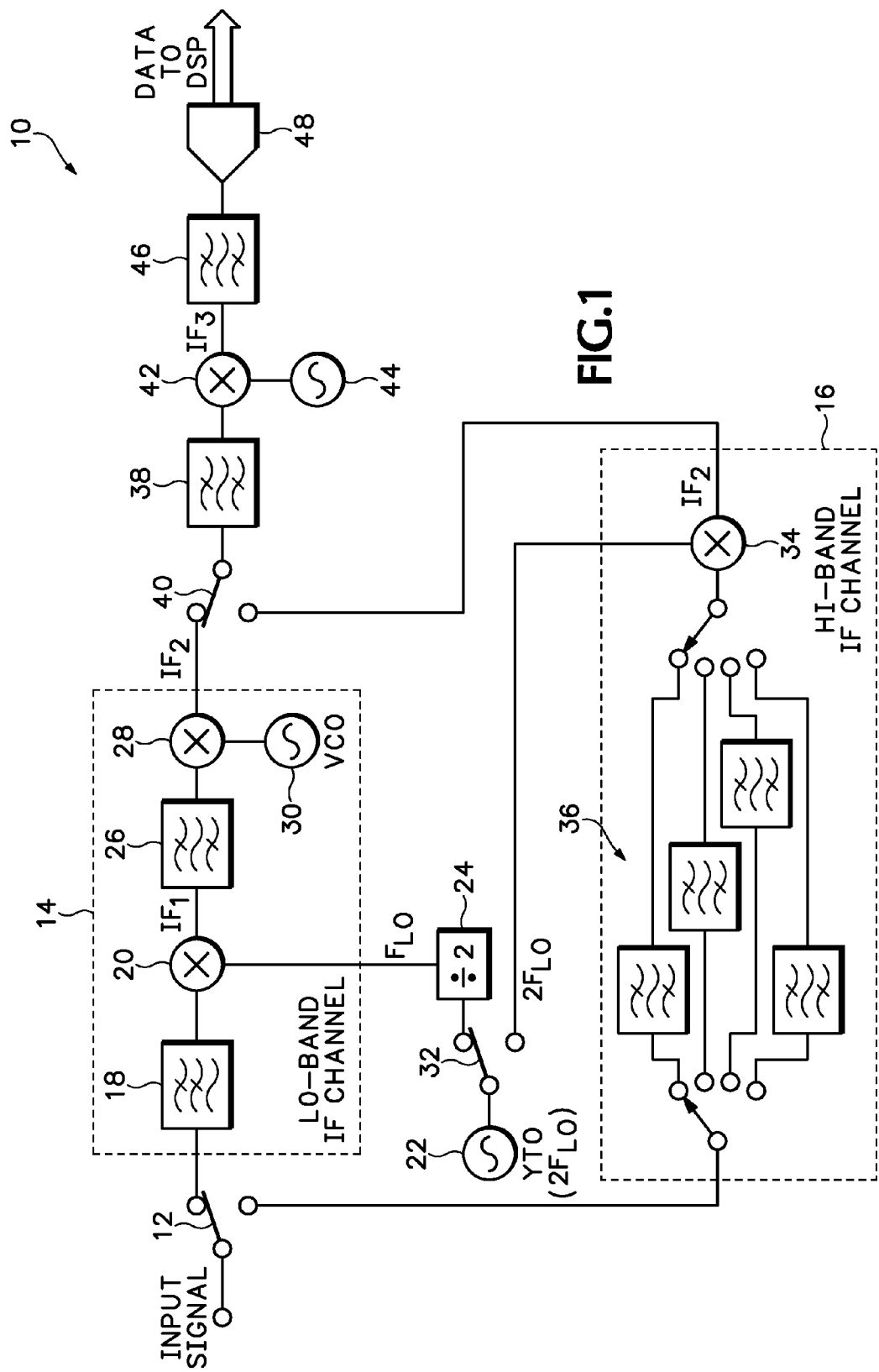
FIG. 1 is a block diagram view of a first implementation of an instrument receiver architecture according to the present invention.

Referring now to FIG. 1 an instrumentation receiver 10 receives an input signal and directs it via an input switch 12 to either a baseband (low frequency band) intermediate frequency (IF) channel 14 or a high frequency band IF channel 16. At the input to the lo-band IF channel 14 is a lowpass filter 18, the output of which is input to a first mixer stage 20. A YIG tuned oscillator (YTO) 22 having a tunable frequency output is input to a counter/divider 24, which for this example is a divide-by-two counter although generally any integer divisor may be used. The particular divisor used is a function of the relationship between the low frequency band IF and the high frequency band IF. The output from the counter/divider 24 is input to the first mixer stage 20, the output of which is a first intermediate frequency ($IF_1$) signal up converted from the input signal. A first bandpass filter 26 acts as an anti-aliasing filter for the $IF_1$ signal which is then input to a second mixing stage 28 having a voltage controlled oscillator (VCO) 30 to produce a down converted second intermediate frequency ($IF_2$) signal.

A local oscillator switch 32 couples the output from the YTO 22 to either the counter/divider 24 or directly to a hi-band mixer stage 34 in the hi-band IF channel 16. At the input to the hi-band IF channel 16 is a bank of preselection, bandpass filters 36 which select a particular frequency pass band from the input signal for input to the hi-band mixer stage 34. The filter in the filter bank 36 chosen depends on the frequency of the energy in the input signal to be measured. Each filter is designed such that it cuts off energy at the image frequencies for that band and rejects local oscillator power from leaking at the input. The hi-band mixer stage 34 acts as a down converter to provide an output signal at the $IF_2$ frequency so that the output signals from both the hi-band and lo-band IF channels 14, 16 are at the same IF. The outputs from the hi-band and lo-band IF channels 14, 16 are input to a second bandpass, anti-aliasing filter 38 via an output switch 40. Further down conversion is achieved in a third mixing stage 42 with its own VCO 44 to provide a third IF signal ($IF_3$) which is input to a third bandpass, anti-aliasing filter 46. This further down conversion may or may not be necessary, depending upon the capabilities of an analog-to-digital converter (ADC) 48, which ADC digitizes the output from the selected IF channel 14, 16 for further processing by a digital signal processor (DSP) (not shown). The IF detection need not be done with an ADC by using a more traditional approach using a logarithmic amplifier and a diode detector. As shown, the hi-band IF channel 16 uses the YTO 22 output directly, while the lo-band IF channel 14 uses a modified frequency range output from the YTO using the counter/divider 24.

In operation one of the lo-band or hi-band IF channels 14, 16 is selected by the input switch 12 to receive a desired frequency range, i.e., 0-M GHz or M-N Ghz respectively. The YTO 22 frequency sweep range is determined by DSP according to the IF channel selected. The low range is up converted in the lo-band IF channel 14 and then down converted, as described above, to obtain $IF_2$. The high range is down converted in the hi-band IF channel 16 to obtain $IF_2$, as described above, with the YTO 22 frequency sweep range being determined by the particular filter in the filter bank 36 that is selected, i.e., according to the particular frequency band in the high range selected for processing.

Figure 2:
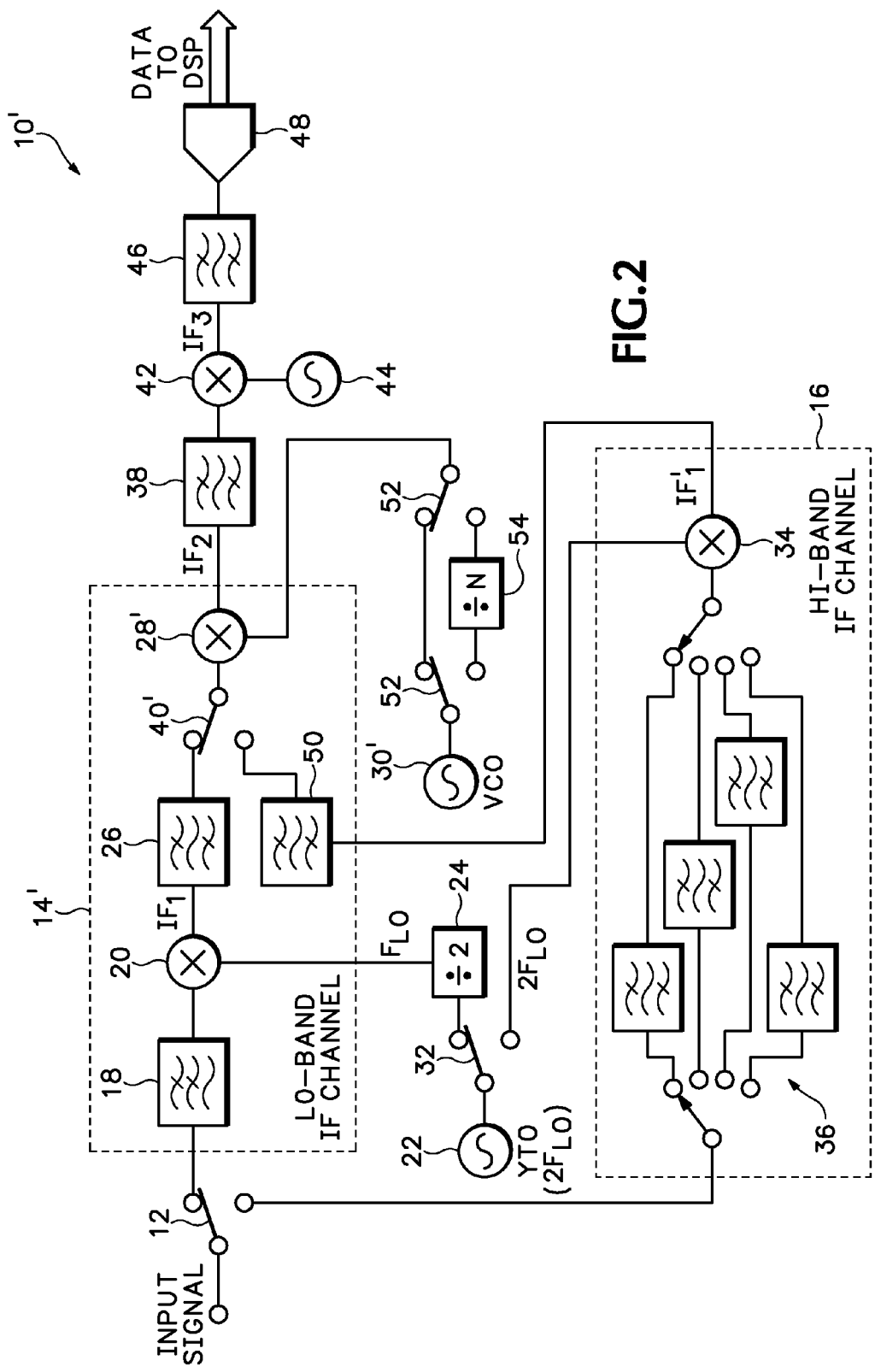
FIG. 2 is a block diagram view of a second implementation of an instrument receiver architecture according to the present invention.

An alternative embodiment is shown in FIG. 2 where the output from the hi-band IF channel 16 is a first hi-band IF signal $IF_1'$. This signal is input to an anti-aliasing, bandpass filter 50, the output of which is input to the channel selection switch 40'. The other input to the channel selection switch 40' is the $IF_1$ from the lo-band IF channel 14. In this case the second stage mixer 28' has a selectable frequency as an input for mixing with the input IF signal. The mixer oscillator 30' is switched by a frequency select switch 52 to be either directly input to the mixer 28' or input via a divide-by-N circuit 54. In either event the output from the second stage mixer 28' is the $IF_2$ signal. In other words the hi-band IF mixing stage 34 output is run in parallel with the lo-band first mixing stage 20 output, with the selection switch 40' being before the second mixing stage 28'. The IF frequencies are chosen such that the mixer oscillator 30' may be divided by an integer "N" to select either the $IF_1'$ signal from the hi-band IF channel 16 or the $IF_1$ signal from the lo-band first mixing stage 20 to produce the $IF_2$ signal. The advantage of this alternative is that the hi-band mixing stage 34 may be placed at a higher frequency than the embodiment of FIG. 1, thereby easing the preselection filter rejection requirements of the filter bank 36 as the image frequencies are farther away.

Figure 3:
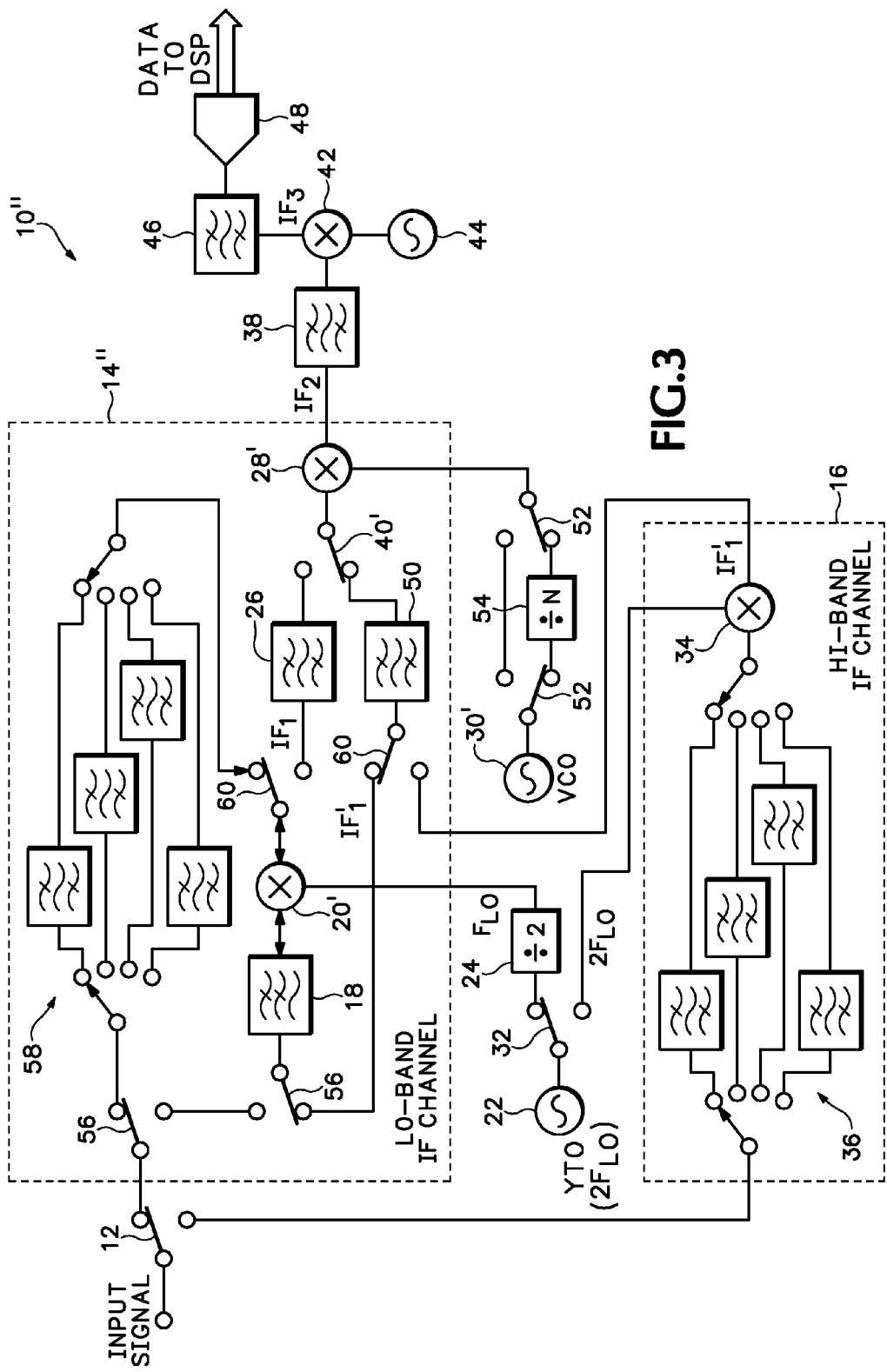
FIG. 3 is a block diagram view of a third implementation of an instrument receiver architecture according to the present invention.

A further refinement of the alternative shown in FIG. 2 is shown in FIG. 3 where at the input to the lo-band IF channel 14 is a selection switch 56 which applies the input signal either to the lowpass filter 18 or to another preselection bank of bandpass filters 58. This extends the first mixing stage 20' up in frequency through the use of it's own preselector filter band switch 56. If the filter bank 58 is not selected, then the input signal proceeds through the lo-band channel 14 as in FIG. 2 via a lo-band selector switch 60. If the filter bank 58 is selected, then the signal is down converted by the mixer 20' by passing through in the opposite direction, with the YTO 22 being retuned accordingly, to produce an $IF_1'$ signal which is filtered by the lowpass filter 18 and input via the lo-band selection switch 60 to the $IF_1'$ bandpass filter 50. The $IF_1'$ signal is then processed as in FIG. 2.

In operation the embodiments in FIGS. 2 and 3 act as described above with respect to FIG. 1, except the IF frequency at the output switch 40' depends upon the particular IF channel 14, 16 selected by the input switch 12. In each instance the frequency range of the YTO 22 is determined by the particular channel and frequency band within the channel that is selected. The YTO sweep frequency range may be above or below the frequency range of the frequency band selected for processing in order to achieve the desired IF frequency, but the DSP makes the appropriate corrections to the data from the ADC 48 to compensate for any inversions. For example, the embodiment of FIG. 3 has been designed to cover a frequency from D.C. to at least 14 GHz, the lo-band IF channel 14 covering 0-8 GHz, with 0-3 GHz being up converted as in FIG. 1 and 3-8 GHz being down converted, and the hi-band IF channel 16 covering 8-14 GHz. For this implementation the YTO frequency sweep range is 9-15.5 GHz, which is less than one octave.

Although the three embodiments described use a YTO as the first local oscillator, other types of tunable oscillators may be used, such as a voltage controlled oscillator (VCO), a bank of VCOs and the like.

Thus the present invention provides a dual IF processing architecture for an instrument receiver having a lo-band IF channel and a hi-band IF channel with a bank of preselection filters in the hi-band IF channel plus optionally another bank of preselection filters in the lo-band IF channel.

What is claimed is:

1. An instrument receiver architecture comprising:
   a low-band IF channel having as an input an RF signal and providing as an output a low-band IF signal;
   a bank of preselection filters having as an input the RF signal and providing as an output a selected frequency band of the RF signal;
   a high-band IF channel having as an input the selected frequency band and providing as an output a high-band IF signal; and
   means for selecting one of the low-band and high-band IF signals for further processing;
   the low-band IF channel comprising an up-converting stage having as an input the RF signal and providing as an output the low-band IF signal for input to the selecting means; and
   wherein the high-band IF channel comprises a down-converting stage having as an input the selected frequency band and providing as an output the high-band IF signal for input to the selecting means, the low-band and high-band IF signals having different intermediate frequencies.

2. The architecture as recited in claim 1 further comprising an output down-converting stage coupled to the selecting means, the output down-converting stage being configurable to convert both the low-band and high-band IF signals to a common IF signal for further processing.

3. The architecture as recited claim 2 further comprising a tunable local oscillator having as outputs a first oscillator frequency signal for input to the low-band IF channel to produce the low-band IF signal and a second oscillator frequency signal for input to the high-band IF channel to produce the high-band IF signal, the second local oscillator frequency signal having a frequency that is higher than the frequency of the first local oscillator frequency signal.

4. The architecture as recited in claim 3 wherein the tunable local oscillator comprises:
   a YIG tunable oscillator having as an output the second oscillator frequency signal; and
   means for deriving the first oscillator frequency signal from the second oscillator frequency signal.

5. The architecture as recited in claim 4 wherein the deriving means comprises a divider having as an input the second oscillator frequency signal and having as an output the first oscillator frequency signal.

6. The architecture as recited in claim 2 wherein the output down-converting stage comprises:
- a mixer having an input coupled to the selecting means and providing as an output the common IF signal;
- a local oscillator providing a first local oscillator signal for mixing with the low-band IF signal when selected by the selecting means and a second local oscillator signal for mixing with the high-band IF signal when selected by the selecting means, the first local oscillator signal having a frequency higher than the frequency of the second local oscillator signal and the low-band IF signal having a higher intermediate frequency than the high-band IF signal.

7. The architecture as recited in claim 6 further comprising a tunable local oscillator having as outputs a first oscillator frequency signal for input to the low-band IF channel to produce the low-band IF signal and a second oscillator frequency signal for input to the high-band IF channel to produce the high-band IF signal, the second local oscillator frequency signal having a frequency that is higher than the frequency of the first local oscillator frequency signal.

8. The architecture as recited in claim 7 wherein the tunable local oscillator comprises:
- a YIG tunable oscillator having as an output the second oscillator frequency signal; and
- means for deriving the first oscillator frequency signal from the second oscillator frequency signal.

9. The architecture as recited in claim 8 wherein the deriving means comprises a divider having as an input the second oscillator frequency signal and having as an output the first oscillator frequency signal.

10. The architecture as recited in claim 6 wherein the local oscillator comprises:
- an oscillator having as an output the first local oscillator signal; and
- means for deriving the second local oscillator signal from the first local oscillator signal.

11. The architecture as recited in claim 10 further comprising a tunable local oscillator having as outputs a first oscillator frequency signal for input to the low-band IF channel to produce the low-band IF signal and a second oscillator frequency signal for input to the high-band IF channel to produce the high-band IF signal, the second local oscillator frequency signal having a frequency that is higher than the frequency of the first local oscillator frequency signal.

12. The architecture as recited in claim 11 wherein the tunable local oscillator comprises:
- a YIG tunable oscillator having as an output the second oscillator frequency signal; and
- means for deriving the first oscillator frequency signal from the second oscillator frequency signal.

13. The architecture as recited in claim 12 wherein the deriving means comprises a divider having as an input the second oscillator frequency signal and having as an output the first oscillator frequency signal.

14. The architecture as recited in claim 10 wherein the deriving means comprises a divider having as an input the first local oscillator signal and having as an output the second local oscillator signal.

15. The architecture as recited in claim 14 further comprising a tunable local oscillator having as outputs a first oscillator frequency signal for input to the low-band IF channel to produce the low-band IF signal and a second oscillator frequency signal for input to the high-band IF channel to produce the high-band IF signal, the second local oscillator frequency signal having a frequency that is higher than the frequency of the first local oscillator frequency signal.

16. The architecture as recited in claim 15 wherein the tunable local oscillator comprises:
- a YIG tunable oscillator having as an output the second oscillator frequency signal; and
- means for deriving the first oscillator frequency signal from the second oscillator frequency signal.

17. The architecture as recited in claim 16 wherein the deriving means comprises a divider having as an input the second oscillator frequency signal and having as an output the first oscillator frequency signal.

18. The architecture as recited in claim 1 further comprising a tunable local oscillator having as outputs a first oscillator frequency signal for input to the low-band IF channel to produce the low-band IF signal and a second oscillator frequency signal for input to the high-band IF channel to produce the high-band IF signal, the second local oscillator frequency signal having a frequency that is higher than the frequency of the first local oscillator frequency signal.

19. The architecture as recited in claim 18 wherein the tunable local oscillator comprises:
- a YIG tunable oscillator having as an output the second oscillator frequency signal; and
- means for deriving the first oscillator frequency signal from the second oscillator frequency signal.

20. The architecture as recited in claim 19 wherein the deriving means comprises a divider having as an input the second oscillator frequency signal and having as an output the first oscillator frequency signal.

21. An instrument receiver architecture comprising:
- a low-band IF channel having as an input an RF signal and providing as an output a low-band IF signal;
- a bank of preselection filters having as an input the RF signal and providing as an output a selected frequency band of the RF signal;
- a high-band IF channel having as an input the selected frequency band and providing as an output a high-band IF signal;
- means for selecting one of the low-band and high-band IF signals for further processing;
- the low-band IF channel comprising an up-converting stage having as an input the RF signal and providing as an output the low-band IF signal for input to the selecting means; and
- a tunable local oscillator having as outputs a first oscillator frequency signal for input to the low-band IF channel to produce the low-band IF signal and a second oscillator frequency signal for input to the high-band IF channel to produce the high-band IF signal, the second local oscillator frequency signal having a frequency that is higher than the frequency of the first local oscillator frequency signal;
- wherein the tunable local oscillator comprises:
- a YIG tunable oscillator having as an output the second oscillator frequency signal; and
- means for deriving the first oscillator frequency signal from the second oscillator frequency signal.

22. The architecture as recited in claim 21 wherein the deriving means comprises a divider having as an input the second oscillator frequency signal and having as an output the first oscillator frequency signal.

* * * * *